United States Patent
Otsuki et al.

(10) Patent No.: US 9,455,355 B2
(45) Date of Patent: Sep. 27, 2016

(54) SEMICONDUCTOR DEVICE

(71) Applicant: Mitsubishi Electric Corporation, Tokyo (JP)

(72) Inventors: Eiko Otsuki, Tokyo (JP); Koji Sadamatsu, Tokyo (JP); Yasuhiro Yoshiura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/888,780

(22) PCT Filed: Jul. 8, 2013

(86) PCT No.: PCT/JP2013/068670
§ 371 (c)(1),
(2) Date: Nov. 3, 2015

(87) PCT Pub. No.: WO2015/004716
PCT Pub. Date: Jan. 15, 2015

(65) Prior Publication Data
US 2016/0087110 A1 Mar. 24, 2016

(51) Int. Cl.
*H01L 29/861* (2006.01)
*H01L 29/06* (2006.01)
(Continued)

(52) U.S. Cl.
CPC ......... *H01L 29/861* (2013.01); *H01L 29/0619* (2013.01); *H01L 29/0638* (2013.01);
(Continued)

(58) Field of Classification Search
CPC ....... H01L 29/0619–29/0623; H01L 29/0834; H01L 29/7395; H01L 29/861; H01L 29/8611; H01L 29/0696; H01L 2924/12036
See application file for complete search history.

(56) References Cited

U.S. PATENT DOCUMENTS 5,969,400 A * 10/1999 Shinohe .............. H01L 27/0761
257/170
6,177,713 B1 * 1/2001 Aono .................. H01L 29/0619
257/170
(Continued)

FOREIGN PATENT DOCUMENTS

JP   H08-316480      11/1996
JP   2000-022176 A   1/2000
(Continued)

OTHER PUBLICATIONS

Notification of Transmittal of Translation of the International Preliminary Report on Patentability and Translation of Written Opinion of the International Searching Authority; PCT/JP2013/068670 issued on Jan. 21, 2016.
(Continued)

*Primary Examiner* — Marvin Payen
*Assistant Examiner* — Jeremy Joy
(74) *Attorney, Agent, or Firm* — Studebaker & Brackett PC

(57) ABSTRACT

An $n^-$-type semiconductor substrate (1) includes an active region and a terminal region disposed outside the active region. A $p^+$-type anode layer (2) is formed in a portion of an upper surface of the $n^-$-type semiconductor substrate (1) in the active region. A plurality of $p^+$-type guard ring layers (3) are formed in a portion of the upper surface of the $n^-$-type semiconductor substrate (1) in the terminal region. An $n^+$-type cathode layer (5) is formed in a lower surface of the $n^-$-type semiconductor substrate (1). An anode electrode (6) is connected to the $p^+$-type anode layer (2). A metallic cathode electrode (7) is connected to the $n^+$-type cathode layer (5). A recess (8) is formed by trenching the $n^+$-type cathode layer (5) in the terminal region. The cathode electrode (7) is also formed in the recess (8).

4 Claims, 4 Drawing Sheets

(51) Int. Cl.
*H01L 29/66* (2006.01)
*H01L 29/739* (2006.01)
*H01L 29/08* (2006.01)

(52) U.S. Cl.
CPC ....... *H01L29/0661* (2013.01); *H01L 29/0696* (2013.01); *H01L 29/0834* (2013.01); *H01L 29/7395* (2013.01); *H01L 29/8611* (2013.01); H01L 2924/12036 (2013.01)

(56) References Cited

U.S. PATENT DOCUMENTS

| | | | | |
|---|---|---|---|---|
| 8,502,345 B2* | 8/2013 | Nemoto | ............... | H01L 29/739 257/288 |
| 9,219,113 B2* | 12/2015 | Takahashi | ........... | H01L 29/0615 |
| 2006/0131685 A1* | 6/2006 | Watanabe | ............... | H01L 23/488 257/483 |
| 2007/0278472 A1* | 12/2007 | Mauder | ................ | H01L 21/263 257/11 |
| 2009/0186627 A1* | 7/2009 | Zhang | ............... | H04W 72/0486 455/453 |
| 2011/0291223 A1* | 12/2011 | Nakamura | .......... | H01L 23/3171 257/493 |
| 2013/0207159 A1* | 8/2013 | Vobecky | ............. | H01L 29/0615 257/172 |

FOREIGN PATENT DOCUMENTS

| | | | | |
|---|---|---|---|---|
| JP | 2000022176 | A | * | 1/2000 |
| JP | 2004-047780 | A | | 2/2004 |
| JP | 2005-142288 | A | | 6/2005 |
| JP | 2005142288 | A | * | 6/2005 |
| JP | 2009-094105 | A | | 4/2009 |
| JP | 2009094105 | A | * | 4/2009 |
| JP | 2009-176772 | A | | 6/2009 |
| JP | 2012-009811 | A | | 1/2012 |
| JP | 2012009811 | A | * | 1/2012 |

OTHER PUBLICATIONS

International Search Report, PCT/JP2013/068670, Oct. 8, 2013.
An Office Action; "Notice of Reasons for Rejection," issued by the Japanese Patent Office on Jun. 28, 2016, which corresponds to Japanese Patent Application No. 2015-526034 and is related to U.S. Appl. No. 14/888,780; with English language partial translation.

* cited by examiner

SEMICONDUCTOR DEVICE

TECHNICAL FIELD

The present invention relates to a semiconductor device such as a diode for use in a power module.

BACKGROUND ART

When a current is caused to flow in a forward direction between a $p^+$-type anode layer and an $n^+$-type cathode layer in a diode, a large number of carriers are accumulated in an $n^-$-type drift layer. Thereafter, when a switch is turned off, the accumulated carriers are discharged and recovery currents (reverse recovery currents) flow. During recovery operation, both the carriers accumulated in an active region and the carriers accumulated in a terminal region flow into the $p^+$-type anode layer. The recovery currents are therefore concentrated on an end portion of the $p^+$-type anode layer to strengthen the electric field and increase the temperature thereof, thereby increasing the possibility of breakdown. A diode having a recess formed by trenching the $n^+$-type cathode layer in the terminal region to prevent this phenomenon has been proposed (see, for example, FIG. 3 of Patent Literature 1).

CITATION LIST

Patent Literature

Patent Literature 1
Japanese Patent Laid-Open No. 2009-094105

SUMMARY OF INVENTION

Technical Problem

In the conventional diode, the cathode electrode is not formed in the recess. There is, therefore, a need to selectively form the cathode electrode on the back surface of the substrate, which means an increase in the number of manufacturing steps. Moreover, while silicon is exposed in the recess, silicon and solder are not alloyed together. Therefore, an ohmic defect occurs at the time of mounting of the diode using solder. A problem in terms of wettability with solder voids also arises.

The present invention has been achieved to solve the above-described problem, and an object of the present invention is to obtain a semiconductor device manufacturable by a simple process and capable of improving the breakdown resistance and the yield.

Means for Solving the Problems

A semiconductor device according to the present invention includes: a substrate including an active region and a terminal region disposed outside the active region; a $p^+$-type anode layer formed in a portion of an upper surface of the substrate in the active region; a plurality of $p^+$-type guard ring layers formed in a portion of the upper surface of the substrate in the terminal region; an $n^+$-type cathode layer formed in a lower surface of the substrate; an anode electrode connected to the $p^+$-type anode layer; and a metallic cathode electrode connected to the $n^+$-type cathode layer, wherein a recess is formed by trenching the $n^+$-type cathode layer in the terminal region, and the cathode electrode is also formed in the recess.

Advantageous Effects of Invention

The present invention makes it possible to simplify the manufacturing process and improve the breakdown resistance and the yield.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
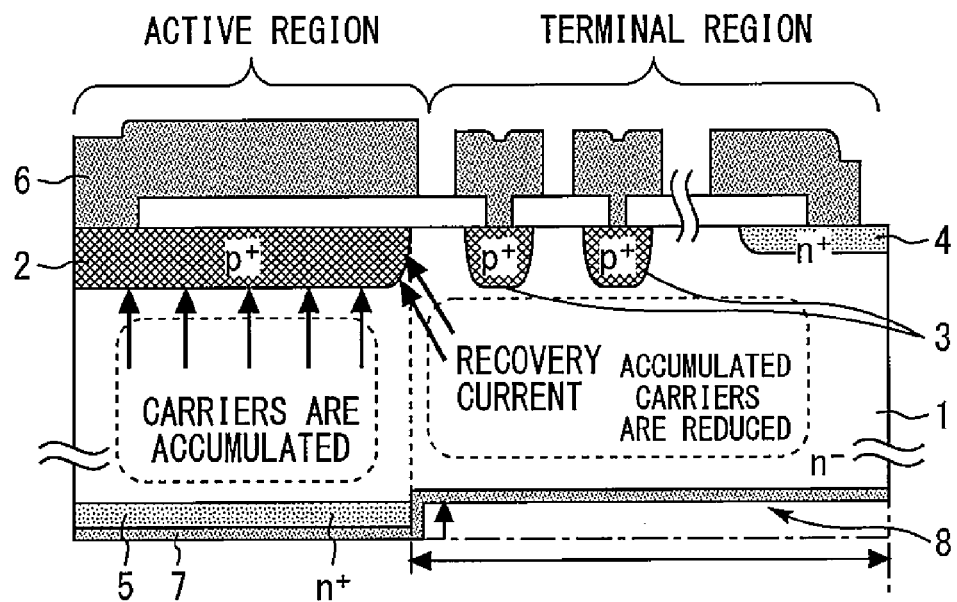
FIG. 1 is a sectional view of a semiconductor device according to Embodiment 1 of the present invention.

FIG. 1 is a sectional view of a semiconductor device according to Embodiment 1 of the present invention. An $n^-$-type semiconductor substrate 1 has an active region and a terminal region disposed outside the active region. In a portion of an upper surface of the $n^-$-type semiconductor substrate 1 (drift layer) in the active region, a $p^+$-type anode layer 2 is formed.

In the upper surface of the $n^+$-type semiconductor substrate 1 in the terminal region, a plurality of floated $p^+$-type guard ring layers 3 are formed. The plurality of $p^+$-type guard ring layers 3 are disposed outward from an end portion of the $p^+$-type anode layer 2 and have a function to weaken an electric field at the end portion of the $p^+$-type anode layer 2.

An $n^+$-type channel stopper layer 4 is formed in an outermost peripheral portion of the upper surface of the $n^-$-type semiconductor substrate 1. An $n^+$-type cathode layer 5 having an impurity concentration higher than that in the $n^-$-type semiconductor substrate 1 is formed in a lower surface of the $n^-$-type semiconductor substrate 1. An anode electrode 6 is connected on the $p^+$-type anode layer 2. A cathode electrode 7 is connected to the $n^+$-type cathode layer 5. The cathode electrode 7 is made of a metal such as nickel having good adhesion to solder.

A feature of the present embodiment is a recess 8 formed by trenching the $n^+$-type cathode layer 5 in the terminal region. The cathode electrode 7 is also formed in the recess 8. That is, the cathode electrode 7 is in contact with the lower surface of the $n^+$-type cathode layer 5 in the active region and is in contact with the lower surface of the $n^-$-type semiconductor substrate 1 in the recess 8 in the terminal region.

Figure 2:
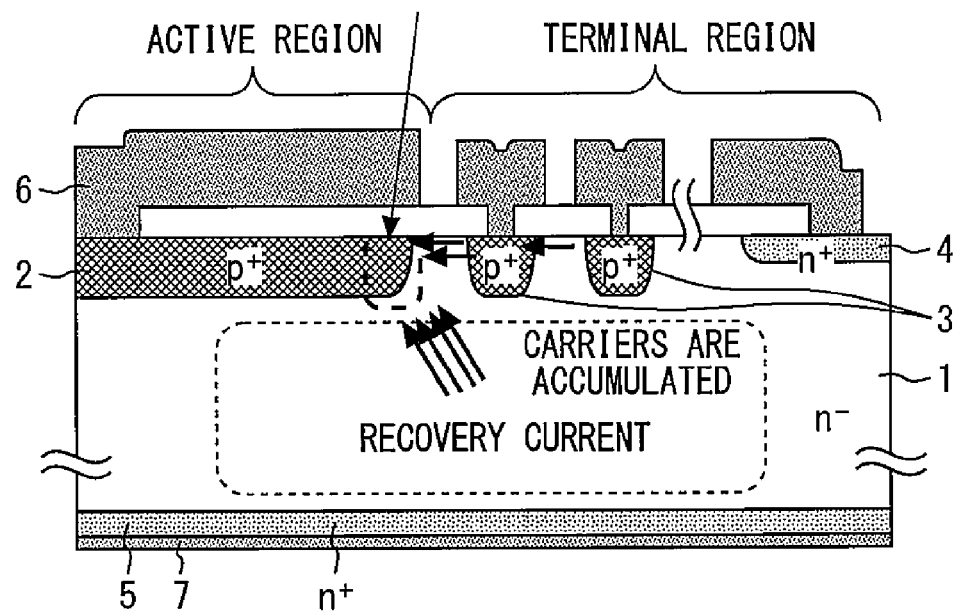
FIG. 2 is a sectional view of a semiconductor device according to the comparative example.

The effects of the present embodiment will subsequently be described while being compared with a comparative example. FIG. 2 is a sectional view of a semiconductor device according to the comparative example. The recess 8 is not provided in the comparative example. In the comparative example, positive holes injected from the anode and electrons injected from the cathode are diffused not only in the active region but also in the terminal region, thereby accumulating a large number of carriers. During recovery operation, both the groups of carriers accumulated in the active region and the terminal region flow into the $p^+$-type anode layer 2. Recovery currents are therefore concentrated on an end portion of the $p^+$-type anode layer 2 to strengthen the electric field and increase the temperature thereof, thereby increasing the possibility of breakdown.

In the present embodiment, the $n^+$-type cathode layer 5 in the terminal region is trenched to limit accumulation in the terminal region of positive holes injected from the anode at the time of application of a forward bias and electrons injected from the cathode at the same time. The amount of carriers accumulated in the n-type semiconductor substrate 1 in the terminal region is reduced. As a result, concentration of recovery currents on the end portion of the $p^+$-type anode layer 2 during recovery operation can be relieved to improve the breakdown resistance.

The cathode electrode 7 is formed on the entire back surface of the substrate. Therefore, the manufacturing process can be simplified in comparison with the related art in which the cathode electrode 7 is patterned so as not to be formed in the recess 8. Further, since the adhesion between the metallic cathode electrode 7 and solder is high, an ohmic defect or the like can be prevented at the time of mounting using solder to achieve an improvement in yield. The cathode electrode 7 has a step in the recess 8. However, no fault results from the step because solder or the like with a thickness of about 100 μm also enters the stepped portion when the diode is die bonded to a product frame.

Figure 3:
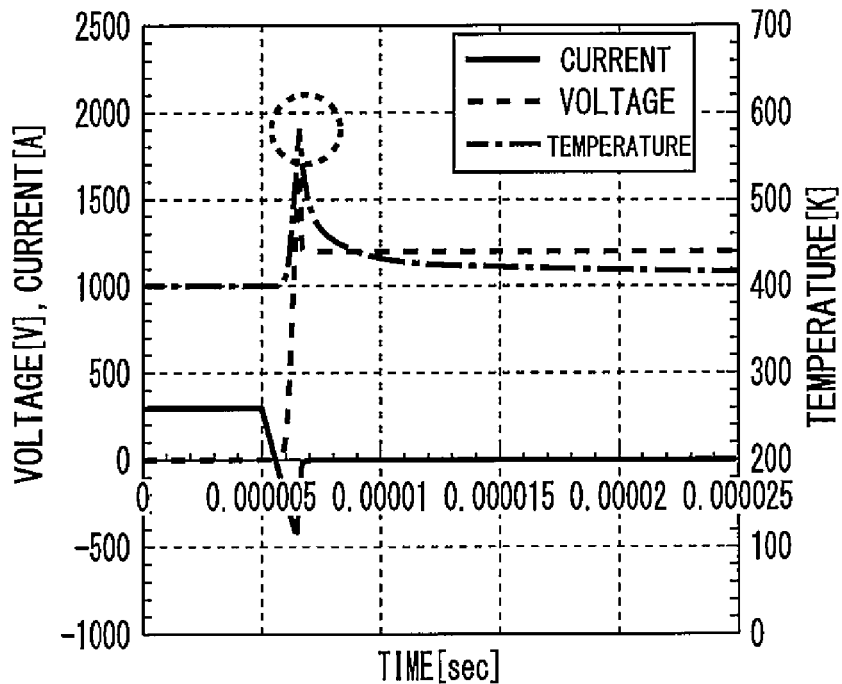
FIG. 3 is a diagram showing a recovery waveform in the semiconductor device according to the comparative example.
Figure 4:
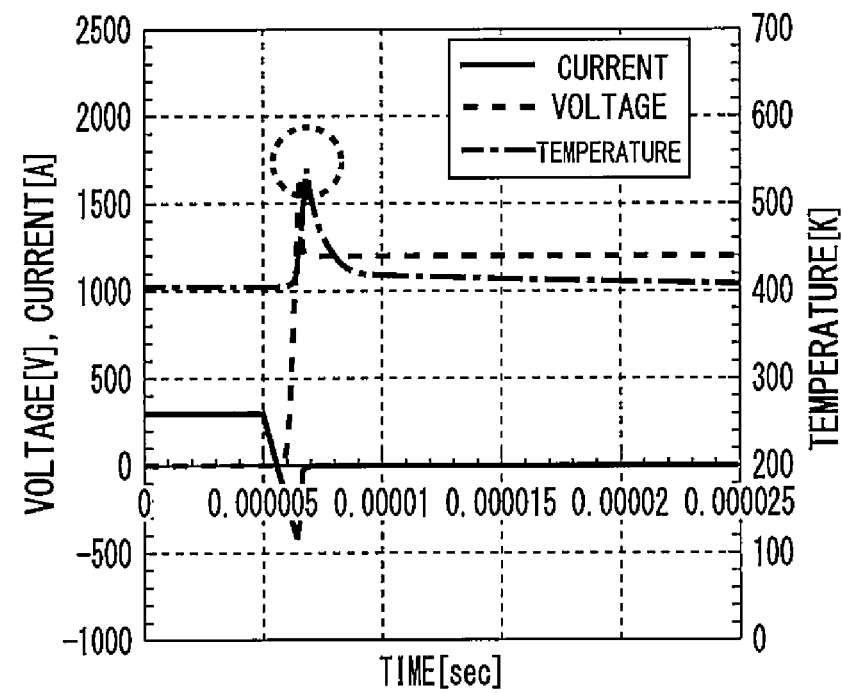
FIG. 4 is a diagram showing a recovery waveform in the semiconductor device according to Embodiment 1 of the present invention.

FIG. 3 is a diagram showing a recovery waveform in the semiconductor device according to the comparative example. FIG. 4 is a diagram showing a recovery waveform in the semiconductor device according to Embodiment 1 of the present invention. It can be understood that the maximum temperature in the present embodiment is lower than that in the comparative example.

In the present embodiment, the $n^+$-type cathode layer 5 is entirely removed in the terminal region. However, this is not necessarily done. Only part of the $n^+$-type cathode layer 5 may be removed, though the effect is higher if the remaining thickness of the $n^+$-type cathode layer 5 is smaller.

Embodiment 2

Figure 5:
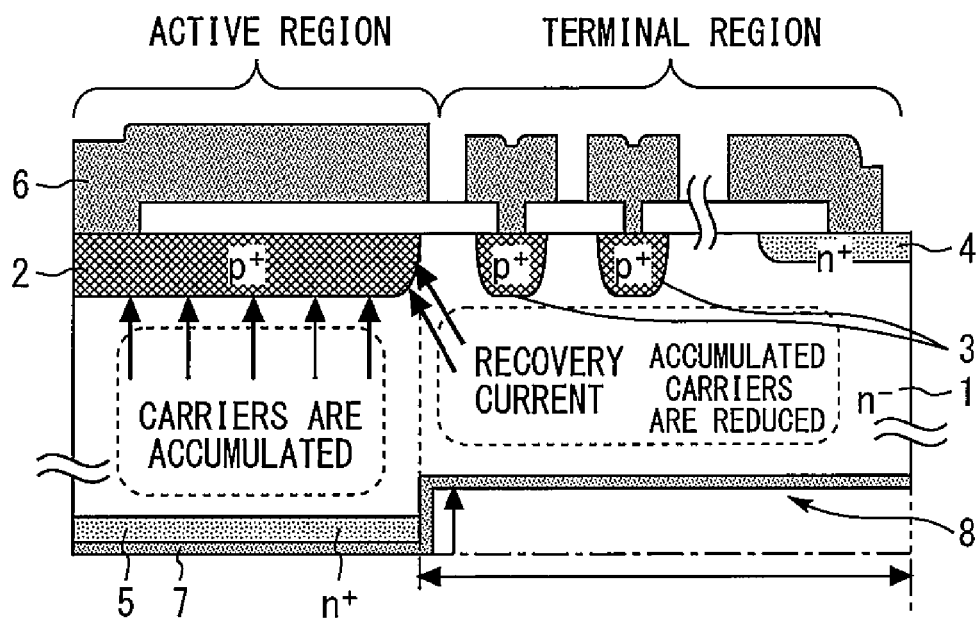
FIG. 5 is a sectional view of a semiconductor device according to Embodiment 2 of the present invention.

FIG. 5 is a sectional view of a semiconductor device according to Embodiment 2 of the present invention. In the terminal region, not only the $n^+$-type cathode layer 5 but also the $n^-$-type semiconductor substrate 1 is trenched to an intermediate position, thereby forming the recess 8. The volume of the $n^-$-type semiconductor substrate 1 in the terminal region is thereby reduced. Thus, the amount of accumulated carriers can be further reduced to achieve a further improvement in breakdown resistance. The effect is improved if the recess 8 is deeper. Accordingly, the depth of the recess 8 is adjusted according to a withstand voltage specification.

Embodiment 3

Figure 6:
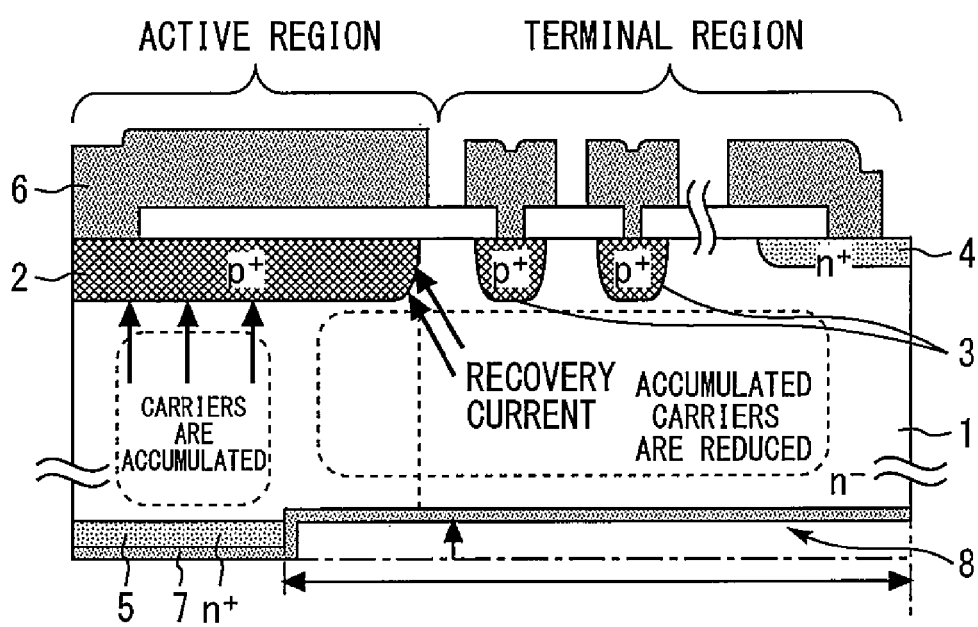
FIG. 6 is a sectional view of a semiconductor device according to Embodiment 3 of the present invention.

FIG. 6 is a sectional view of a semiconductor device according to Embodiment 3 of the present invention. The recess 8 extends not only through the terminal region but also to an intermediate position in the active region (right below the pt-type anode layer 2). Recovery currents concentrated on the end portion of the $p^+$-type anode layer 2 can be further reduced thereby. A further improvement in breakdown resistance can thus be achieved. The effect is improved if the width of the recess 8 is larger. Accordingly, the width of the recess 8 is adjusted according to a VF characteristic specification.

Embodiment 4

Figure 7:
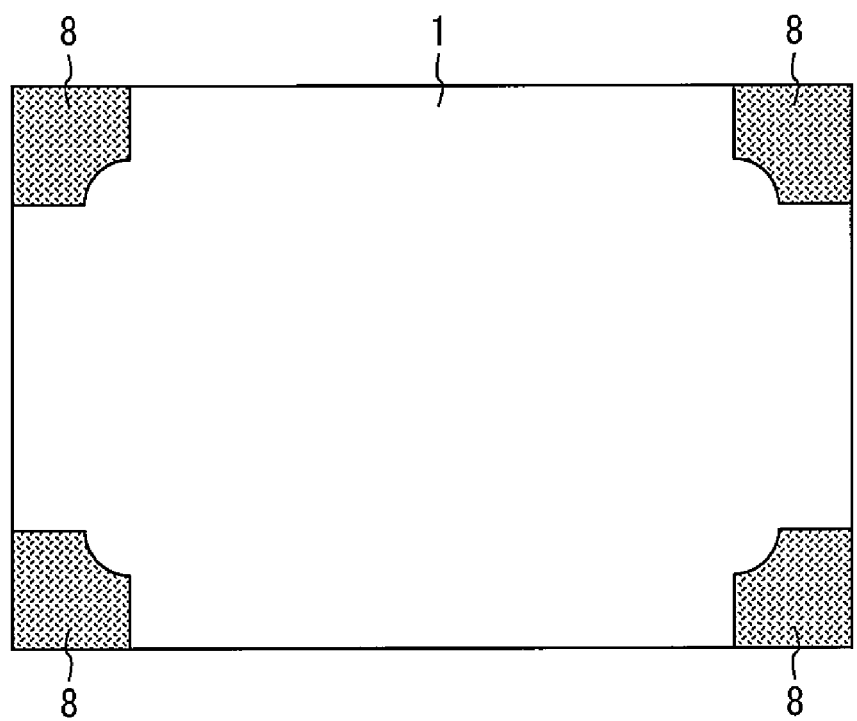
FIG. 7 is a bottom view of a semiconductor device according to Embodiment 4 of the present invention.

FIG. 7 is a bottom view of a semiconductor device according to Embodiment 4 of the present invention. Recesses 8 are formed only in corner portions of the substrate as viewed in plan. With this arrangement, breakdown of the corner portions where breakdown can occur easily and an increase in VF can be effectively inhibited.

While cases of application of the present invention to 1200 [V] FZ thin-wafer diodes have been described as Embodiments 1 to 4, the same effects can also be obtained no matter what the voltage class is.

The semiconductor devices according to Embodiments 1 to 4 are not limited to being formed of silicon. A semiconductor device formed of a wide-bandgap semiconductor having a bandgap wider than that of silicon may suffice. The wide-bandgap semiconductor is, for example, silicon carbide, a gallium nitride-based material or diamond. A semiconductor device formed of such a wide-bandgap semiconductor has a high-withstand-voltage characteristic and a high allowable current density and can therefore be reduced in size. A semiconductor module incorporating this device reduced in size can also be reduced in size. Since the heat resistance of the device is high, heat radiating fins of a heat sink can be reduced in size and a water cooling portion can be replaced with an air cooling portion. The semiconductor module can therefore be further reduced in size. Also, the element has a reduced power loss and high efficiency. The semiconductor module can therefore be improved in efficiency.

DESCRIPTION OF SYMBOLS

1 $n^-$-type semiconductor substrate (substrate), 2 $p^+$-type anode layer, 3 $p^+$-type guard ring layer, 5 $n^+$-type cathode layer, 6 anode electrode, 7 cathode electrode, 8 recess

The invention claimed is:
1. A semiconductor device comprising:
  a substrate including an active region and a terminal region disposed outside the active region;
  a $p^+$-type anode layer formed in a portion of an upper surface of the substrate in the active region;
  a plurality of $p^+$-type guard ring layers formed in a portion of the upper surface of the substrate in the terminal region;
  an $n^+$-type cathode layer formed in a lower surface of the substrate;
  an anode electrode connected to the $p^+$-type anode layer; and
  a metallic cathode electrode connected to the $n^+$-type cathode layer,
  wherein a recess is formed by completely removing the $n^+$-type cathode layer in the terminal region, and the cathode electrode is also formed in the recess.
2. The semiconductor device of claim 1, wherein in the terminal region, not only the $n^+$-type cathode layer but also the n⁻-type semiconductor substrate is trenched to an intermediate position to form the recess.

3. The semiconductor device of claim 1, wherein the recess extends not only through the terminal region but also to an intermediate position in the active region.

4. A semiconductor device comprising:
- a substrate including an active region and a terminal region disposed outside the active region;
- a p⁺-type anode layer formed in a portion of an upper surface of the substrate in the active region;
- a plurality of p⁺-type guard ring layers formed in a portion of the upper surface of the substrate in the terminal region;
- an n⁺-type cathode layer formed in a lower surface of the substrate;
- an anode electrode connected to the p⁺-type anode layer; and
- a metallic cathode electrode connected to the n⁺-type cathode layer,
- wherein a recess is formed by trenching the n⁺-type cathode layer in the terminal region, and the cathode electrode is also formed in the recess, and
- wherein the recess is formed only in a corner portion of the substrate as viewed in plan.

* * * * *